(12) United States Patent
Hsu et al.

(10) Patent No.: US 9,125,316 B2
(45) Date of Patent: Sep. 1, 2015

(54) CHIP CARD HOLDER FOR ELECTRONIC DEVICE

(71) Applicant: Chi Mei Communication Systems, Inc., New Taipei (TW)

(72) Inventors: Wei-Chih Hsu, New Taipei (TW); Chin-Yu Hsu, New Taipei (TW)

(73) Assignee: Chi Mei Communication Systems, Inc., New Taipei (TW)

( * ) Notice: Subject to any disclaimer, the term of this patent is extended or adjusted under 35 U.S.C. 154(b) by 174 days.

(21) Appl. No.: 13/928,962

(22) Filed: Jun. 27, 2013

(65) Prior Publication Data

US 2014/0055925 A1   Feb. 27, 2014

(30) Foreign Application Priority Data

Aug. 21, 2012  (TW) .............................. 101130186 A

(51) Int. Cl.
*H05K 1/14*   (2006.01)
*H05K 7/14*   (2006.01)
*H04B 1/3816* (2015.01)

(52) U.S. Cl.
CPC ............ *H05K 7/1417* (2013.01); *H04B 1/3816* (2013.01)

(58) Field of Classification Search
USPC ............ 361/679.01, 727, 728, 736, 737, 748, 361/759, 801, 802, 803, 807, 810, 825; 455/575.1–575.3, 575.7; 439/135, 136, 439/142, 625, 626, 629, 630, 439
See application file for complete search history.

(56) References Cited

U.S. PATENT DOCUMENTS

| | | | |
|---|---|---|---|
| 5,655,917 A * | 8/1997 | Kaneshige et al. | 439/155 |
| 7,442,086 B1 * | 10/2008 | Chang | 439/630 |
| 7,744,000 B2 * | 6/2010 | Yang et al. | 235/486 |
| 7,837,486 B2 * | 11/2010 | Li | 439/159 |
| 8,976,521 B2 * | 3/2015 | Liu et al. | 361/679.38 |
| 2010/0234070 A1 * | 9/2010 | Li et al. | 455/558 |
| 2011/0051391 A1 * | 3/2011 | Wei et al. | 361/818 |

* cited by examiner

*Primary Examiner* — Hung S Bui
(74) *Attorney, Agent, or Firm* — Novak Druce Connolly Bove + Quigg LLP

(57) ABSTRACT

A chip card holder includes a single tray, a first latching member, and a second latching member and can accommodate two chip cards. The tray defines a receiving groove and includes a first latching end, a second latching end and two limiting plates. The first latching member and the second latching member are slidably engaged with the tray. When the first latching member abuts against the first latching end and the second latching member abuts against the second latching end, the first latching member, the second latching member and the two limiting plates are configured for positioning two chip cards. The first latching member and the second latching member can be slid relative to the tray to abut against the limiting plates also positioning and holding a single chip card.

12 Claims, 8 Drawing Sheets

CHIP CARD HOLDER FOR ELECTRONIC DEVICE

BACKGROUND

1. Technical Field

The present disclosure generally relates to card use in electronic devices, and particularly to a chip card holder for an electronic device.

2. Description of related art

With the development of wireless communication and information processing technologies, portable electronic devices such as mobile phones are widely used. Chip cards having special circuits are used in portable electronic devices to enhance or add to the functions of the portable electronic devices. For example, a subscriber identity module (SIM) card can be placed in a mobile phone to unlock and dedicate the mobile phone's functions to the SIM card owner. By changing SIM cards, a single mobile phone can be used by many different SIM card owners as a personal phone.

According to various requirements, users may need to use two different chip cards (such as SIM cards, memory cards) in an electronic device. However, a typical dual card securing mechanism needs two separate seats. The dual seats not only take up too much space of the electronic device, but also involves more costs.

Therefore, there is room for improvement within the art.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the chip card holder. Moreover, in the drawings, like reference numerals designate corresponding parts throughout the several views.

DETAILED DESCRIPTION

The disclosed surface contact card holder can seat chip cards such as SIM cards, compact flash cards (CFs) and multimedia cards (MMCs), for example. The disclosed electronic device in the exemplary embodiment is a mobile phone and can alternatively be a PDA, camera, recorder, or other device, while remaining within the scope of the disclosure.

Figure 1:
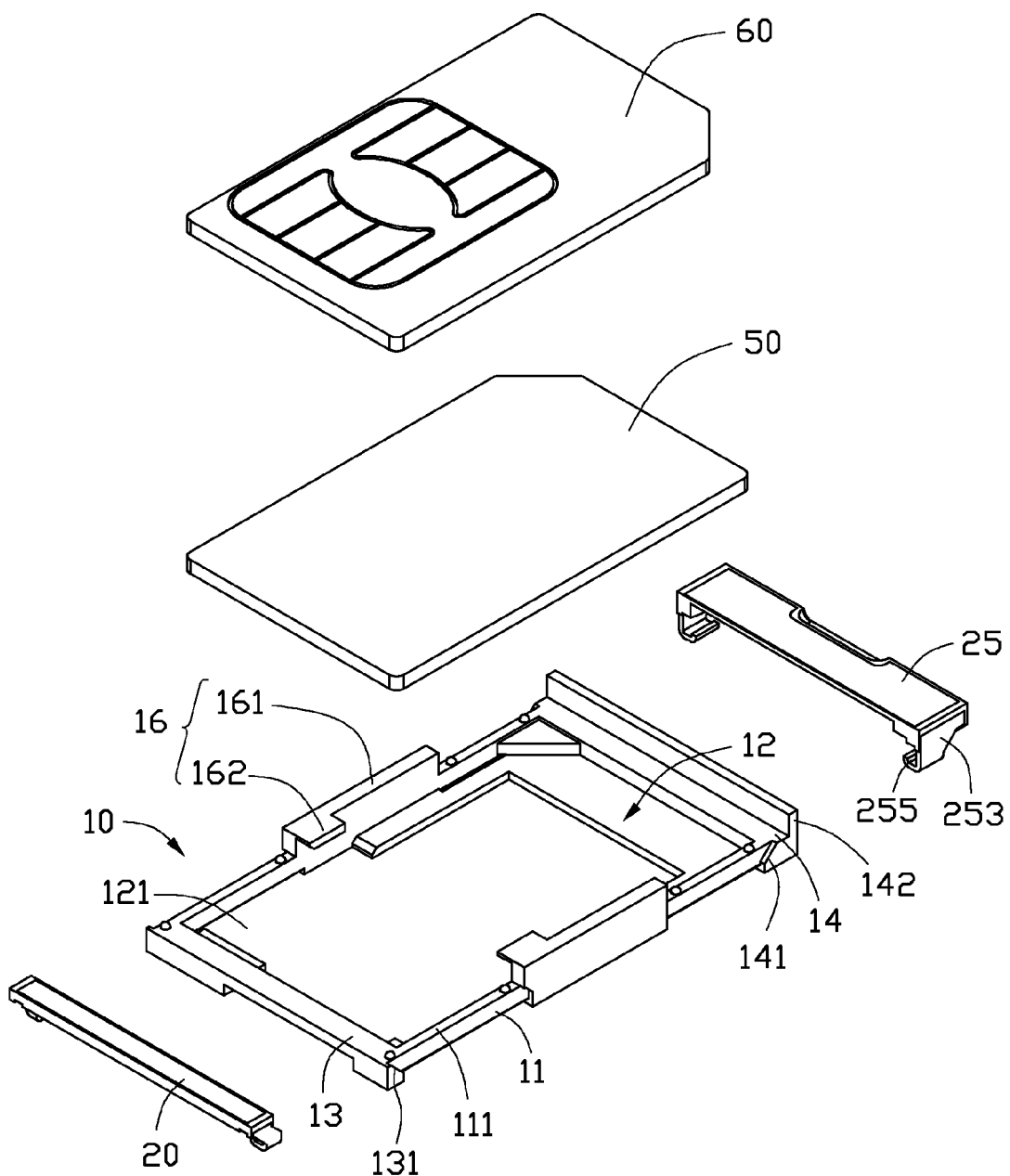
FIG. 1 is an exploded view of one embodiment of the chip card holder with two chip cards.
Figure 2:
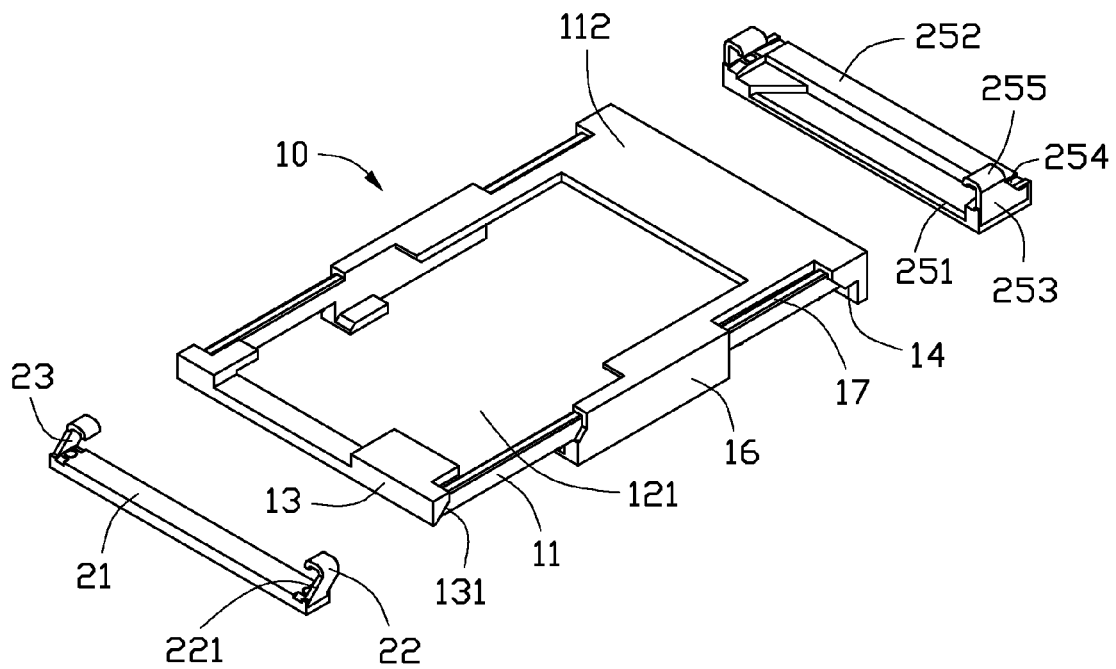
FIG. 2 is similar to FIG. 1, but viewed from anther aspect without the two chip card.

FIGS. 1 and 2 show a chip card holder to receive two chip cards 50, 60. The chip card holder comprises a tray 10, a first latching member 20, and a second latching member 25. The first latching member 20 and the second latching member 25 are slidably engaged with the tray 10 for latching the chip cards 50, 60. Additionally, the first latching member 20 and the second latching member 25 slide relative to each other for each to latch one of the chip card 50, 60.

The tray 10 has a tray body 11 which has a first surface 111 and a second surface 112. A receiving groove 12 is defined in the first surface 111 for receiving the chip cards 50, 60. The receiving groove 12 defines a through hole 121 communicating with the first surface 111 and the second surface 112. The tray 10 has a first latching end 13 and a second latching end 14 at opposite ends. Opposite sides of the first latching end 13 have two opposite first stopping surfaces 131 for limiting movement of the first latching member 20. Opposite sides of the second latching end 14 have two opposite second stopping surfaces 141, for limiting movement of the second latching member 25. The tray 10 has a flange 142 connected to the second latching end 14.

The tray 10 has two limiting plates 16 and two rails 17 at opposite sides of the receiving groove 12. Each limiting plate 16 is formed in a middle area of each guiding rail 17. Each limiting plate 16 has a first extending tab 161 and a second extending tab 162 at the first surface 111 of the tray 10. The first extending tab 161 perpendicularly extends from the first surface 111. The second extending tab 162 perpendicularly extends from the first extending tab 161 and is parallel to the first surface 111. The two rails 17 are formed in the second surface 112 as guides for the sliding of the first latching member 20 and the second latching member 25.

The first latching member 20 has a plate body 21 and two first guiding hooks 22 located at opposite ends of the plate body 21. Each first guiding hook 22 defines a first guiding groove 23 and has a first slopping surface 221 configured for engaging with a first stopping surface 131. The guiding grooves 23 of the first guiding hooks 22 receive the rails 17. The first latching member 20 is slidably attached to the tray 10 and is stopped by the first latching end 13.

The second latching member 25 has a first plate portion 251, a second plate portion 252, and two second guiding hooks 253. The first plate portion 251 is thinner than the second plate portion 252. Each second guiding hook 253 defines a second guiding groove 25 and has a first sloping surface 254, configured for engaging with a second stopping surface 141. The second guiding grooves 25 of the second guiding hooks 253 receive the rails 17. The second latching member 25 is slidably attached to the tray 10 and is stopped by the second latching end 14.

Figure 3:
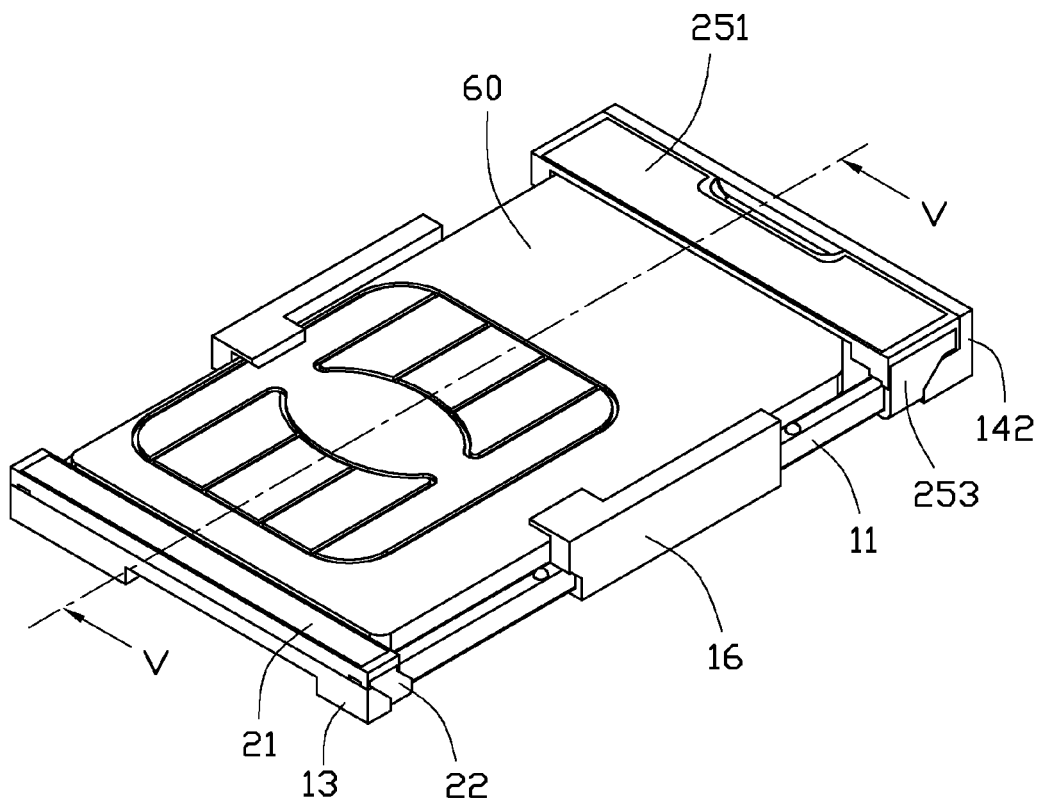
FIG. 3 is an assembled view of the chip card holder with the two chip cards.
Figure 5:
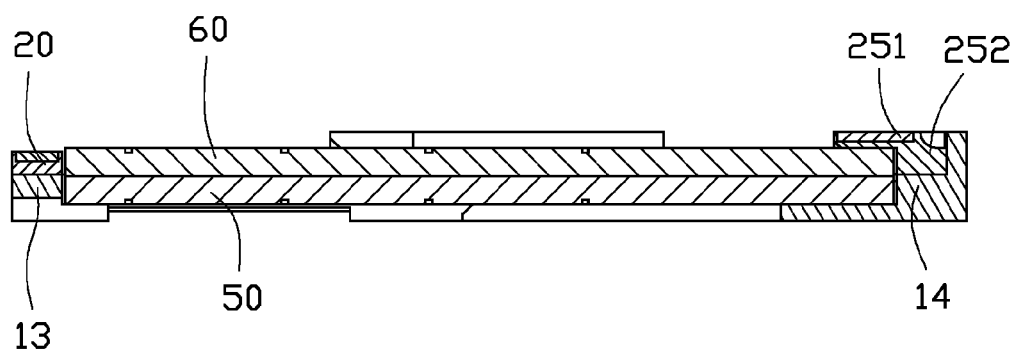
FIG. 5 is a cross sectional view of the card holder in FIG. 3 taken along line V-V.
Figure 6:
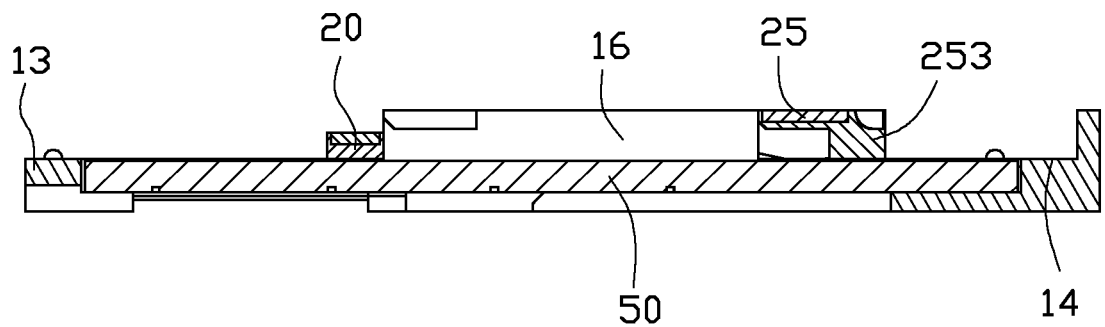
FIG. 6 is a cross sectional view of the card holder in FIG. 4 taken along line VI-VI.

FIGS. 3 and 5 show that in use the surface contact cards 50 and 60 are together inserted into the chip card holder. The surface contact card 50 is received in the receiving groove 12, and the surface contact card 60 overlaps the surface contact card 50 and is stopped by the limiting plates 16. The plate body 21 of the first latching member 20 abuts against a first end of the surface contact card 60, a second end of the surface contact card 60 is supported by the first plate portion 251, and the second extending plate portion 252 abuts against the second end of the surface contact card. Thus, the surface contact cards 50 and 60 are together positioned on the chip card holder.

Figure 4:
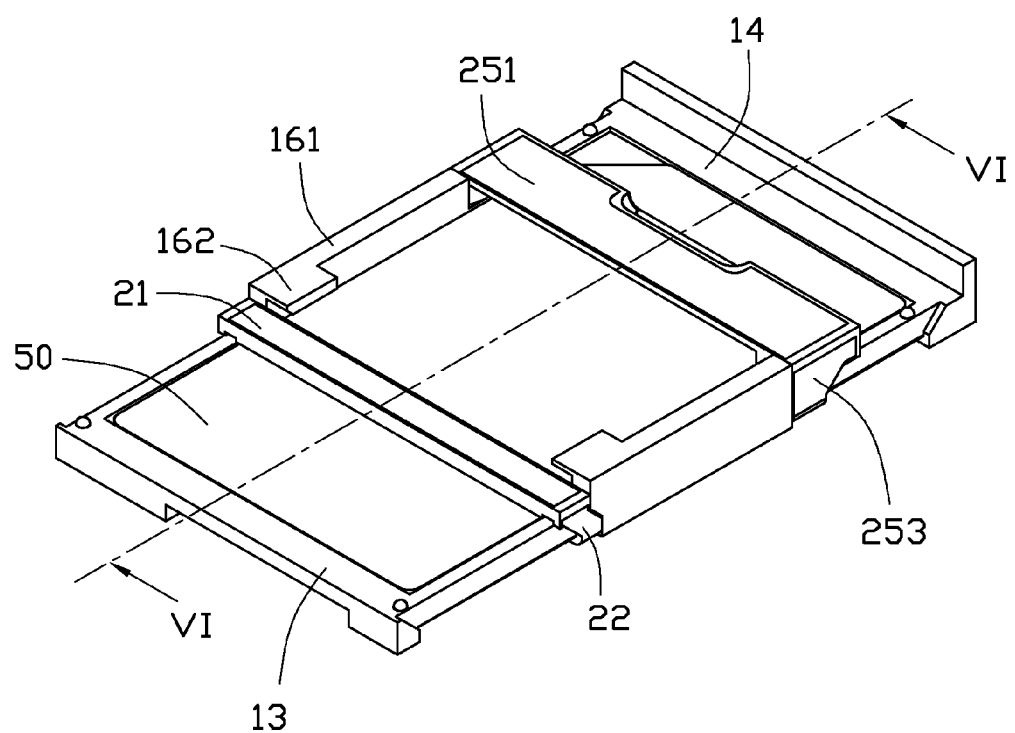
FIG. 4 is an assembling view of the chip card holder with one of the two chip cards.

FIGS. 4 and 5 show that in use only the surface contact card 50 is inserted into the chip card holder. The surface contact card 50 is received in the receiving groove 12. The first latching member 20 and the second latching member 25 are slid along the rails 17 toward the limiting plates 16 until the first latching member 20 and the second latching member 25 abut against opposite sides of the limiting plates 16. The second plate portion 252 contacts the surface contact card 50 to prevent the chip card 50 separating from the receiving groove 12.

Figure 7:
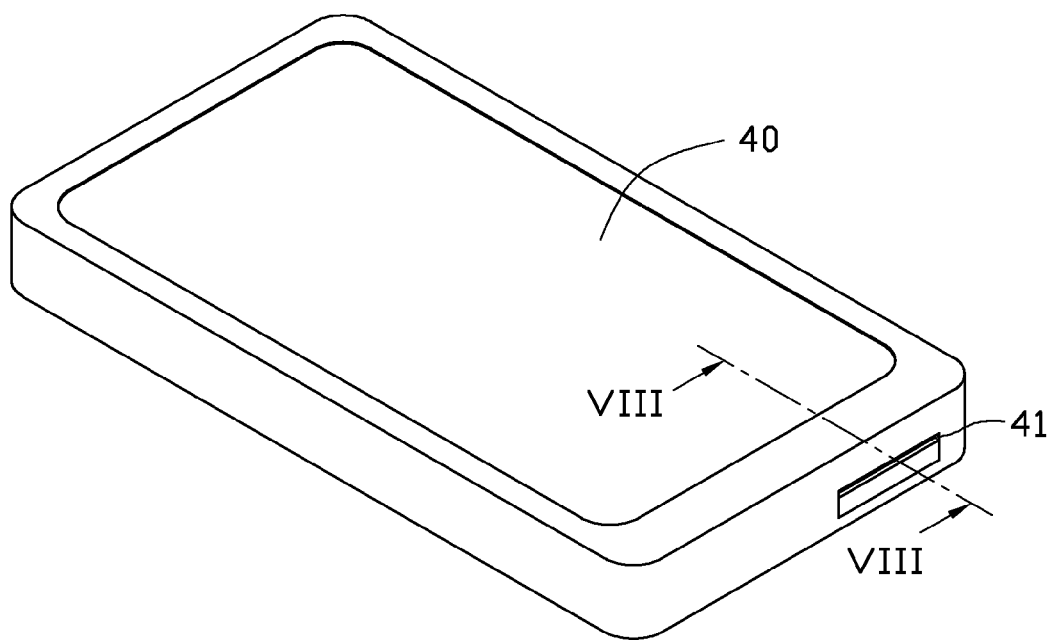
FIG. 7 is an isometric view of the chip card holder used in an electronic device.
Figure 8:
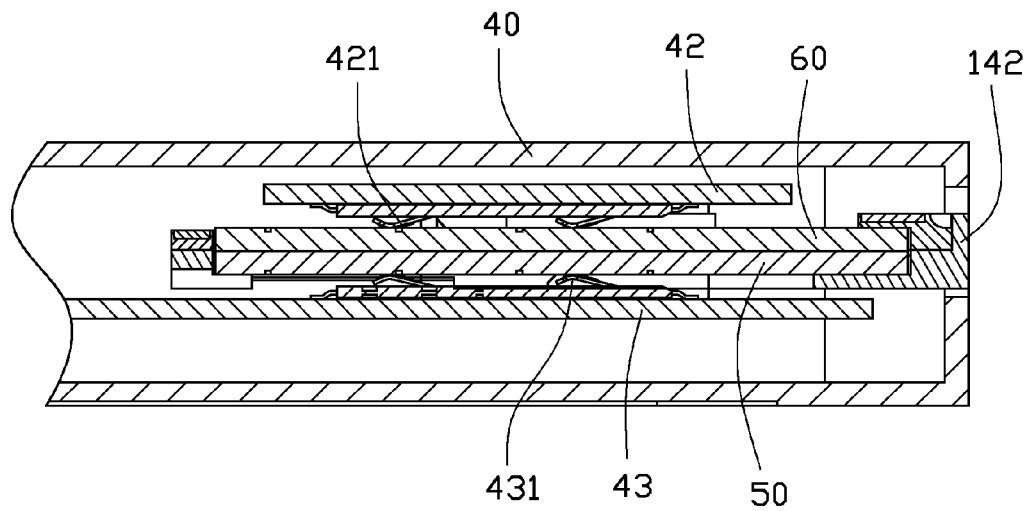
FIG. 8 is a cross sectional view of the card holder taken along line VIII-VIII of FIG. 7.

FIGS. 7 and 8 show a chip card holder mounted on an electronic device. The electronic device comprises a housing 40, a first printed circuit board 42 and a second printed circuit board 43. The housing 40 defines an opening 41. The first printed circuit board 42 has a first connector 421 and the second printed circuit board 43 has a first connector 431. The chip card holder is assembled in the housing 40. The first connector 421 is electronically connected to the chip card 50, and the second connector 431 is electronically connected to the chip card 60.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A chip card holder, comprising:
a tray defining a receiving groove and comprising a first latching end, a second latching end, and two limiting plates;
a first latching member slidably engaged with the tray;
a second latching member slidably engaged with the tray;
wherein the first latching member abuts the first latching end and the second latching member abuts the second latching end, the first latching member, the second latching member and the two limiting plates are configured for positioning two chip cards; the first latching member and the second latching member are slid relative to the tray to abut the two limiting plates configured for positioning one chip card.

2. The chip card holder as claimed in claim 1, wherein opposite sides of the first latching end have two opposite first stopping surfaces for stopping the first latching member, and opposite sides of the second latching end have two opposite second stopping surfaces for stopping the second latching member.

3. The chip card holder as claimed in claim 2, wherein the tray has two guiding rails at opposite sides of the receiving groove, and each limiting plate is located in a middle area of each guiding rail, and the two guiding trails slidably guide the first latching member and the second latching member.

4. The chip card holder as claimed in claim 3, wherein each limiting plate has a first extending tab and a second extending tab, and the second extending tab perpendicularly extends from the first extending tab.

5. The chip card holder as claimed in claim 4, wherein the first latching member has a plate body and two first guiding hooks located at opposite ends of the plate body, each first guiding hook defines a first guiding groove, the first guiding grooves of the two first guiding hooks receive the two guiding trails.

6. The chip card holder as claimed in claim 5, wherein the second latching member has a first plate portion, a second plate portion, and two second guiding hooks; each second guiding hook defines a second guiding groove; the second guiding grooves of the second guiding hooks receive the two guiding trails.

7. A portable electronic device comprising:
a housing defining an opening;
a chip card holder received in the housing through the opening, comprising:
a tray defining a receiving groove and comprising a first latching end, a second latching end;
a first latching member slidably engaged with the tray;
a second latching member slidably engaged with the tray;
wherein the first latching member abuts the first latching end and the second latching member abuts the second latching end, the first latching member, the second latching member are configured for positioning two chip cards.

8. The portable electronic device as claimed in claim 7, wherein opposite sides of the first latching end have two opposite first stopping surfaces for stopping the first latching member, and opposite sides of the second latching end have two opposite second stopping surfaces for stopping the second latching member.

9. The portable electronic device as claimed in claim 8, wherein the tray has two guiding rails at opposite sides of the receiving groove, and each limiting plate is located in a middle area of each guiding rail, the two guiding trails slidably guide the first latching member and the second latching member.

10. The portable electronic device as claimed in claim 9, wherein each limiting plate has a first extending tab and a second extending tab, and the second extending tab perpendicularly extends from the first extending tab.

11. The portable electronic device as claimed in claim 10, wherein the first latching member has a plate body and two first guiding hooks located at opposite ends of the plate body, each first guiding hook defines a first guiding groove, the two guiding grooves of the first two guiding hooks receive the trails.

12. The portable electronic device as claimed in claim 11, wherein the second latching member has a first plate portion, a second plate portion, and two second guiding hooks; each second guiding hook defines a second guiding groove; the second guiding grooves of the second guiding hooks receive the trails.

\* \* \* \* \*